United States Patent [19]

Bertrand

[11] Patent Number: 4,697,169
[45] Date of Patent: Sep. 29, 1987

[54] DEVICE FOR DETECTING AND LOCALIZING A FAULT IN AN AERIAL ROPE-WAY TRANSPORT INSTALLATION

[75] Inventor: Jean-Jacques Bertrand, Fontaine, France

[73] Assignee: Pomagalski S.A., Fontaine, France

[21] Appl. No.: 781,726

[22] Filed: Sep. 30, 1985

[30] Foreign Application Priority Data

Oct. 15, 1984 [FR] France ............................ 84 15867

[51] Int. Cl.$^4$ ............................................. G08B 21/00
[52] U.S. Cl. ..................................... 340/540; 104/178; 104/179; 340/650; 340/652; 340/661; 340/679
[58] Field of Search .............. 340/540, 679, 650, 652, 340/661; 104/179, 178, 1 R

[56] References Cited

U.S. PATENT DOCUMENTS 4,003,314 1/1977 Pearson ............................. 104/178
4,088,988 5/1978 Berger .

FOREIGN PATENT DOCUMENTS 0095956 12/1983 European Pat. Off. .
2313247 12/1976 France .
21408495 6/1979 France .
2440637 5/1980 France .
2504482 10/1982 France .

Primary Examiner—Glen R. Swann, III
Attorney, Agent, or Firm—Parkhurst & Oliff

[57] ABSTRACT

A safety line 20 of an aerial ropeway transport installation 10 comprises in one of the stations a safety generating unit 22, which emits a square wave AC signal on the line.

In the opposite station the line 20 is earthed by means of a diode 24. The safety generating unit 22 includes a measuring device of the positive and negative voltages at the line terminals to distinguish between a line break and a line short-circuit.

A localizer indicates the location of the fault.

13 Claims, 6 Drawing Figures

DEVICE FOR DETECTING AND LOCALIZING A FAULT IN AN AERIAL ROPE-WAY TRANSPORT INSTALLATION

BACKGROUND OF THE INVENTION

The invention relates to a detection device of the electrical condition of a safety line extending along an aerial ropeway transport installation.

The essential role of a detection device of the kind mentioned or of a safety system for example such as described in U.S. Pat. No. 4,003,314 is to monitor the safety line and to give an installation shutdown order as soon as continuity of the line is no longer established. Interruption of the safety line may result from an end-of-travel or emergency contact opening or from the action of an incident detector, for example detecting that the rope has been derailed from the sheaves of a tower, causing a safety strip to break or the line to be cut. The break is more or less clean and the conventional devices measure the apparent resistance of the line which comprises two parameters:

the serial resistance RL, constituted by the resistance of the rope and the sum of the resistances of the contacts inserted in the line and the parallel resistance RP, due to resistive or capacitive leaks, for example at the level of the towers. Measuring the apparent resistance does not constitute a reliable method, as an incident causing an increase in the serial resistance by opening of a contact could easily be masked by a concomitant decrease in the parallel resistance, the combination of these effects being expressed by a correct apparent resistance.

The object of the present invention is to produce a reliable device which detects a safety line malfunction without any ambiguity.

SUMMARY OF THE INVENTION

The detection device according to the invention comprises a current or square wave AC signal generator housed in one of the stations and connected on the one hand to the end of the safety line and on the other hand to a return circuit constituted by the earth or a return conductor which forms with the safety line a loop circuit joining the two stations, a rectifier device, such as a diode, located in the opposite station from the generator and inserted in said loop circuit, and a measuring device, located in the generator station to measure the positive and negative alternations of said signal and to supply a signal representative of the line condition.

When the polarity of the signal applied to the line corresponds to the flowing direction of the diode, the apparent resistance of the line is measured in the usual way. During the following alternation of opposite polarity, the blocked diode breaks the line and the mesurement corresponds closely to the parallel resistance RP.

By making these two measurements, one corresponding to the closed line and the other one to the open line, it is possible to determine the electrical condition of the line.

Supposing that the + signal corresponds to the flowing direction of the diode, it can be stated as a first approximation that the presence of the signal during the + alternation and the absence thereof during the − alternation express a continuity of the line.

The absence of the + signal and of the − signal corresponds to a break in the line and the presence of the − signal and of the + signal corresponds to a line short-circuit, notably a line earthing.

The permanent presence of interference resistances serial and parallel to the line affects the measurements, which are less accurate, and according to a further development of the invention, shutdown of the installation is brought about when the measurements are not within a preset range, which can easily be calculated.

In normal operation, the voltage on the line cannot be lower than a diode voltage, nor more negative than the negative signal generated, and the measuring device detects these abnormal conditions.

The electronic measuring circuit comprises a dual-circuit selector, one to emit the AC signal on the line and the other to collect the positive +VL and negative −VL voltages on the line by filtering capacitors.

The voltages +VL and −VL are each applied to a comparator circuit operating in dynamic mode, which causes the installation to shut down as soon as a single transition disappears on one of these comparators.

There is dual frequency (presence of each pulse) and amplitude (RP and RL measurement) monitoring.

The detection device is advantageously combined with an incident localizer, baseed on wave reflection by line discontinuity or short-circuit. For this purpose, the rising front of the signal emitted on the line by the detector device is used, the variation of which s representative of the nature of the incident and of the duration of the wave path, i.e. of the distance at which the fault is located.

A display system completes the detection and localization devices.

Measurement is carried out by scanning and comparing with a stored line condition which is reputed to be correct. This stored reference condition can be updated automatically at any time to take account of slow variations in the characteristic line values and thus avoid spurious fault indications.

BRIEF DESCRIPTION OF THE DRAWINGS

Other advantages and characteristics of the invention will become more clearly apparent from the description which follows of an embodiment of the invention, given as an example only and represented in the accompanying drawings, in which.

DESCRIPTION OF THE PREFERRED EMBODIMENTS

Figure 1:
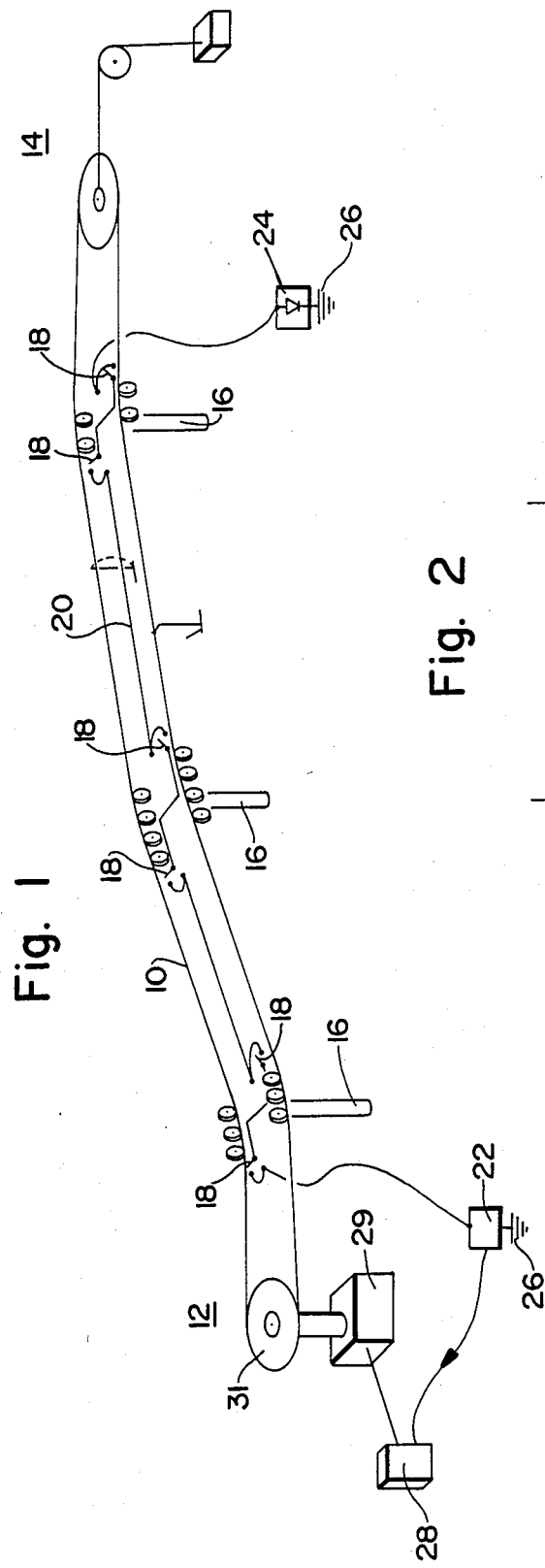
FIG. 1 is a schematis perspective view of a chairlift equipped with a detection device according to the invention.

In FIGS. 1 to 5, the rope 10 of a chair-lift extends between a driving station 12 and a return station 14 and is supported by towers 16. The invention is described as applying to a chair-lift, but is clearly applicable to any rope transporter, notably a surface lift, gondola lift, aerial tramway or the like. The towers 16 are fitted with sensors detecting that there are no breaks in the rope supports, inparticular rope derailment detectors which open electrical contact 18 in the event of a rope's falling. These contacts 18 are serial connected in a safety line 20 constituted for example by an electrical cable extending between the stations 12, 14.

The safety line 20 is connected in the driving station 12 to a generating set 22 and in the return station via a rectifier element, for example a diode 24, to the earth 26. The generating set 22 is also connected to the earth 26 which constitutes the return conductor, which can alternately be performed by a second cable joining the two stations 12, 14. The generating set 22 is connected to the power supply unit 28 of the motor 29 which drives the bull wheel 31 of the rope 10 to shut the installation down in the event of the safety line's being broken.

An aerial ropeway installation of this kind is well known to specialists and it is pointless describing it in greater detail.

According to the present invention, a generator 30 (FIG. 4) of the generating set 22 emits an AC signal, for example a square AC voltage signal +Vo and −Vo on the safety line 20. The line 20 acts as an electrical circuit having a serial resistance RL and a parallel resistance RP, the serial resistance RL resulting from the resistances of the elements making up the line 20 connected in series, notably the contacts 18 and the line rope.

Figure 2:
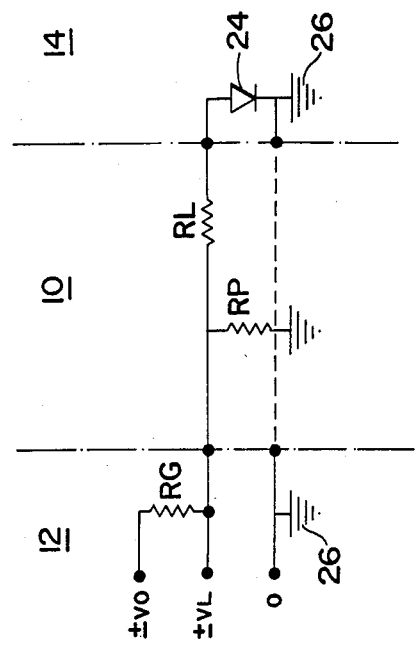
FIG. 2 shows the equivalent electrical diagram of the safety line.

The parallel resistance RP is ude to the leakage resistances to the earth 26. In FIG. 2 it can be seen that for a positive signal +Vo the diode 24 is conductive and almost all the current flows through the serial resistor RL, the value of which is much lower than that of the parallel resistor RP.

The voltage +VL, present at the terminals of the line 20, is essentially a function of the serial resistance RL. On the following alternation of the voltage −Vo signal, the diode 24 is blocked and the current flows only through the parallel resistor RP, the measured voltage −VL being representative of this parallel resistor. Opening of a contact 18 has no notable effect on the voltage −VL, the current in the line 20 being already blocked by the diode 24. For positive polarity, however, opening of a contact 18 corresponds to an increase in the serial resistance RL, theoretically up to infinity, and a corresponding increase in the voltage +VL.

The use of an AC signal and of a diode located in the return station thus makes it possible by monitoring the voltage of the line 20 to determine selectively the serial resistance RL and the parallel resistance RP.

In FIG. 2 the internal resistor of the generator 30 of the safety system 22 is marked RG. The generator 30 is controlled by a clock 32 (FIG. 4) to emit a square +Vo, −Vo AC signal applied to the safety line 20.

Figure 3:
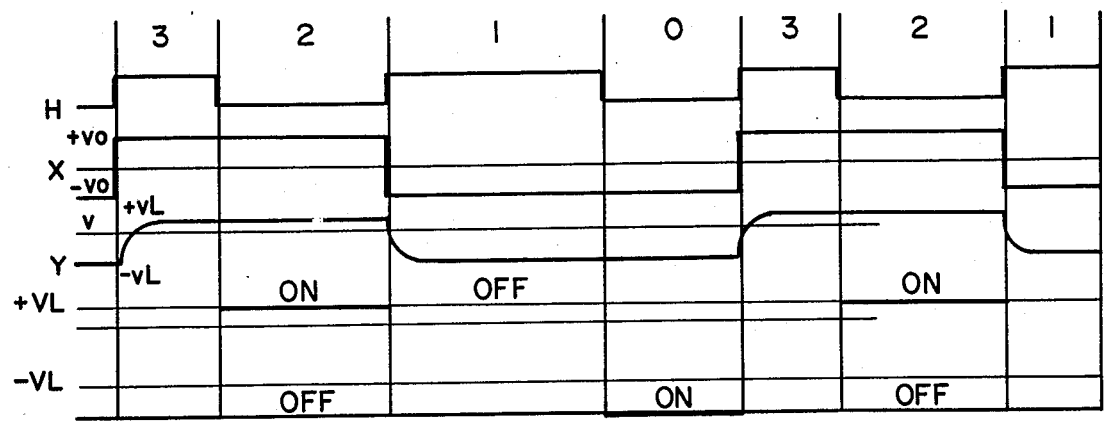
FIG. 3 illustrates operation of the selectors.
Figure 4:
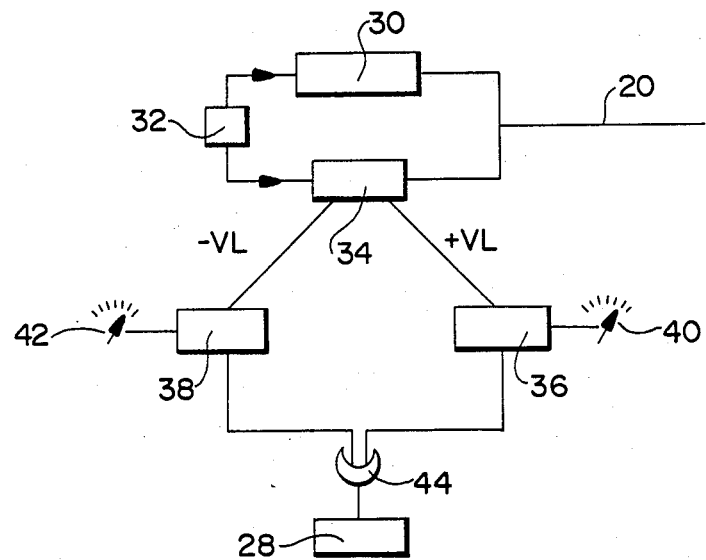
FIG. 4 is a block diagram of the safety line.

The signal is represented by the curve X in FIG. 3, the clock corresponding to the curve H. The +VL and −VL signals collected at the terminals of the line 20 by a measuring circuit 34 are represented by Y. The measuring circuit 34 comprises a selector controlled by the clock 32 which collects the +VL and −VL signals to avoid transients. Each +VL, −VL signal is transmitted to a comparison channel 36, 38 having a display 40, 42 of the threshold values SL, SP with which the +VL, −VL signals are compared.

The channel 36 emits a chair-lift shutdown signal when VL overshoots the threshold SL whereas the channel 38 emits a shutdown signal when the VL signal is lower than the threshold SP. The values of SL and SP depend on the characteristics of the installation and they can be determined by calculation if the parameters are known, notably the resistances RL, RP and RG, or by trial and error.

Each channel 36, 38 can icnlude a second display to define a range within which the +VL or −VL signal must be situated.

The shutdown signals emitted by the channels 36, 38 are applied to an OR gate 44 which transmits the signal to the motor power supply unit 28. The safety system of course comprises a display of the signal which causes the installation to shut down.

Figure 5:
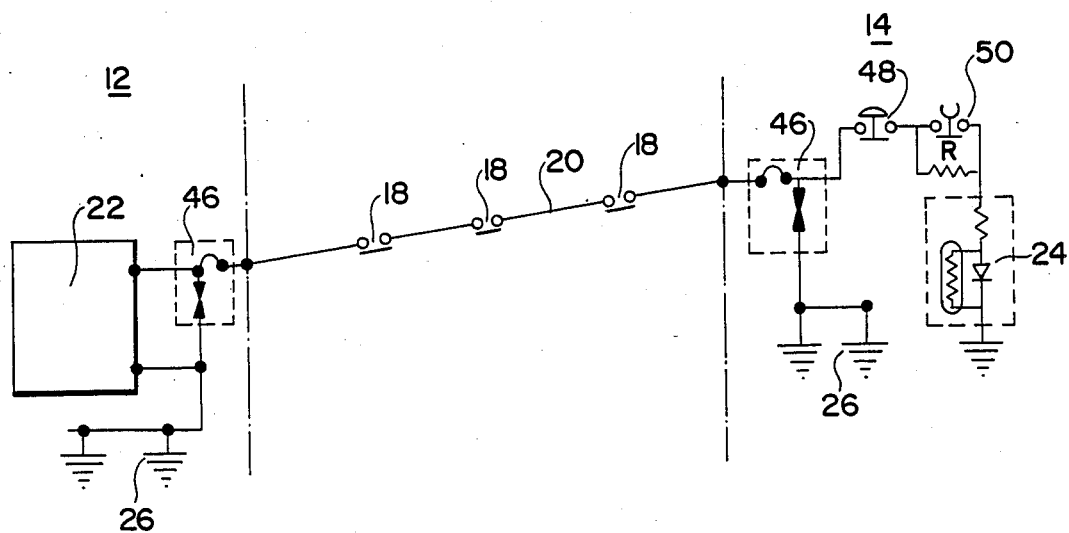
FIG. 5 is a schematic view of the safety line.

FIG. 5 shows a safety line 20 according to the invention equipped with lightning arresters 46 in each of the stations 12, 14. The station 14 equipped with the rectifier unit 24 comprises an emergency stop pushbutton switch 48 and a switch 50 operated by the safety gate. The two switches 48, 50 are connected in series in the safety line 20 to shut the installation down when they open in the manner described previously for the contacts 18.

A resistor R is fitted parallel with the switch 50, the current being diverted by this shunt resistor R when the switch opens. The value of this resistor being known and of course being different from the resistance introduced when a tower contact 18 opens, the value of the +VL signal makes it possible to distinguish between the opening of this switch 50 and that of the contacts 18.

The detection device described above is, according to a perfection of the invention, combined with an incident localizer using wave reflection on an oen or short-circuited line.

Figure 6:
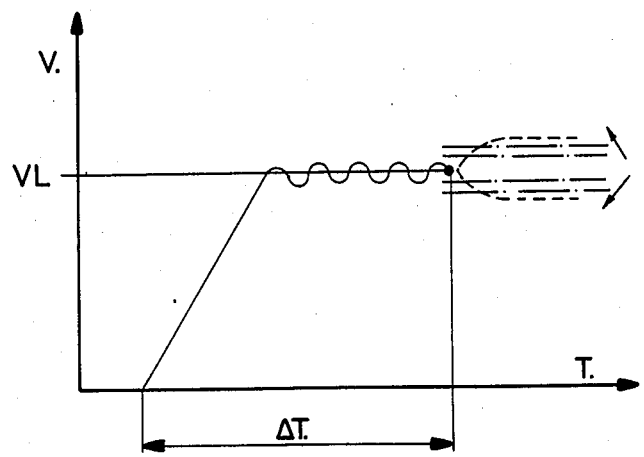
FIG. 6 shows the curve of the variation of the signal front analyzed by the localizer.

The distance at which the fault is located is determined from the measurement of the time the wave takes to cover the distance from the end of the measurement to the fault and to return. According to the invention, the rising front of the signal emitted on the safety line 20 by the unit 22 is analyzed. The oscillogram in FIG. 6 shows a sudden variation of the +VL signal where the fault is located, the signal increasing when the line opens and decreasing when a line short-circuit occurs. The time Δt between the beginning of the signal and the sudden change point is proportional to the distance, which enables the fault to be localized. This distance is visualized, for example by indicating the tower involved.

The signal emitted by the safety unit can of course have any shape, provided that it presents pulse fronts.

Its frequency should preferably be considerably higher than that of the electrical mains but spaced-out measurements would not fall outside the scope of the invention. The generator and measuring device can be of any kind.

The detection accuracy is considerably improved by the fact that the standard response curve can at any time be correct3d in terms of the evolution of the line (within validated limit conditions), whence a floating zero accuracy.

I claim:

1. A detection device of the electrical condition of a safety line extending along the whole length of an aerial ropeway transport installation between the two terminal stations and comprising a plurality of electrical contacts located at intervals along the line, said contacts being electrically connected in series in the line and controlled for opening by fault detectors, notably of a rope derailment, comprising:

an AC signal generator located in one of the stations and connected on the one hand to the end of the safety line and on the other hand to a return circuit constituted by the earth or a return conductor which forms with the safety line a loop circuit joining the two stations, a rectifier device, such as a diode, located in the opposite station from that of the generator and inserted in said loop circuit, and a measuring device located in the same station as the generator, to measure the positive and negative alternations (+VL, −VL) of said signal and to supply a signal representative of the line condition.

2. The detection device according to claim 1, wherein the measuring device measures the voltages (+VL, −VL) at the terminals of the safety line respectively for the current alternation corresponding to the flowing direction of the rectifier, one voltage +VL being essentially representative of the serial resistance RL of the line and for the opposite alternation, the corresponding voltage −VL being essentially representative of the parallel leakage resistance RP of the line.

3. The detection device according to claim 2, wherein the measuring device generates an installation shutdown signal when the voltage +VL is greater than a preset threshold SL or when the voltage −VL is lower than a preset threshold SP.

4. The detection device according to claim 3, wheein a shutdown signal is emitted when the serial resistance RL is greater than 1500 ohms.

5. The detection device according to claim 4, wherein the shutdown signal is emitted when the serial resistance (RL) is lower than that of the rectifier device.

6. The detection device according to claim 3 wherein a shutdown signal is emitted when the parallel resistance RP is lower than 3200 ohms.

7. The detection device according to claim 3, wherein an alarm is emitted when the serial resistance RL is greater than 1500 ohms.

8. The detection device according to claim 7, wherein the alarm is emitted when the serial resistance (RL) is lower than that of the rectifier device.

9. The detection device according to claim 3, wherein an alarm is emitted when the parallel resistance RP is lower than 3200 ohms.

10. The detection device according to claim 2, wherein the measuring device generates a fault when the voltage +VL is greater than a preset threshold SL or when the voltage −VL is lower than a preset threshold SP.

11. The detection device according to claim 1, whereina shutdown contact is inserted at the end of the line in said opposite station, said contact being shunted by a resistor (R) of a lower value than the minimum resistance of any one of said plurality of electrical contacts.

12. The detection device according to claim 1 wherein the measuring device analyzes the rising front oft he signal emitted on the line and determines a large variation revealing that an incident has occurred, as well as the time between the signal being emitted and detection of said variation to localize the incident.

13. The detection device according to claim 1, wherein said generator emits a square wave AC signal having a frequency greater than that of the electrical mains.

* * * * *